United States Patent [19]

Staebler et al.

[11] 4,286,212
[45] Aug. 25, 1981

[54] VARIABLE SIGNAL GENERATOR FOR GALVANOMETER EXHIBITING HYSTERESIS

[75] Inventors: David L. Staebler, Lawrenceville; George R. Latham, Jr., Trenton, both of N.J.

[73] Assignee: The United States of America as represented by the Secretary of the Navy, Washington, D.C.

[21] Appl. No.: 940,571

[22] Filed: Sep. 8, 1978

Related U.S. Application Data

[63] Continuation of Ser. No. 788,332, Apr. 18, 1977, abandoned.

[51] Int. Cl.³ .............. G01R 1/14; H02K 33/18; G02B 27/17
[52] U.S. Cl. .................. 324/125; 318/134; 324/97; 350/6.6; 350/486
[58] Field of Search ............. 324/125, 115, 130, 97; 361/149; 318/685, 126, 134; 346/109; 350/6.6, 285

[56] References Cited

U.S. PATENT DOCUMENTS

| | | | |
|---|---|---|---|
| 2,441,984 | 5/1948 | Armstrong | 361/149 |
| 2,959,722 | 11/1960 | Gilinson, Jr. | 361/149 |
| 3,482,163 | 12/1969 | Peek et al. | 324/117 R |
| 3,509,458 | 4/1970 | Girard | 346/109 |
| 3,873,179 | 3/1975 | Burke | 350/3.64 |

OTHER PUBLICATIONS

"Preliminary Instruction . . . ", Model LA 50–03B & LA 50–03BM, Lamda Electronics Corp., Huntington, N.Y.

*Primary Examiner*—Ernest F. Karlsen
*Attorney, Agent, or Firm*—R. S. Sciascia; Henry Hansen

[57] ABSTRACT

Switch means having a predetermined number of switch positions normally applies any selected one of the same predetermined number of separate control signals to a galvanometer in accordance with the switch position to which the switch means is operated. However, in response to each operation of the switch means between switch positions, a reference signal is applied to the galvanometer for a given time. This overcomes the degrading effect of hysteresis on galvanometer accuracy.

7 Claims, 3 Drawing Figures

VARIABLE SIGNAL GENERATOR FOR GALVANOMETER EXHIBITING HYSTERESIS

This invention herein disclosed was made in the course of or under a contract, or subcontract thereunder, with the Department of the Navy.

This is a continuation of application Ser. No. 788,332, filed 04/18/77, now abandoned.

This invention relates to a variable control signal generator for operating a galvanometer and, more particularly, to such a variable control signal generator which provides repeatable angular displacements of the galvanometer with great accuracy.

The read out of highly-packed information stored in a volume hologram, such as described in U.S. Pat. No. 3,873,179, requires that the hologram be accessed by a narrow laser light beam with an angular accuracy of $10^{-2}$ degrees or better. Such high angular accuracy of a narrow laser beam is also required for such applications as laser-ranging or survey systems (e.g., for measurements of earth movements using a large number of bench marks), or for shifting the position of a laser beam used to read out information stored on a moving medium. A conventional way to provide controlled angular deflection of the light beam is with a mirror mounted on a signal-controlled galvanometer. However, a galvanometer exhibits hysteresis. This hysteresis makes it difficult to achieve repeatable random access of any one of a plurality of discrete angular positions of the mirror with great accuracy (e.g. $10^{-2}$ degrees or better). The present invention is directed to a simple apparatus for achieving such high-accuracy repeatable angular access.

In the present system simple means are provided for automatically ensuring that the control signal applied to the galvanometer movement is always returned to a reference level for a given time just before it is changed to a new value. Thus, each new angle to which it is desired that the movement rotate is referenced from substantially the same reference position. This substantially eliminates the degrading effect of the hysteresis of the galvanometer on the accuracy with which the galvanometer may be repeatably angularly displaced by each separate one of randomly-applied various predetermined values of the control signal.

Figure 1:
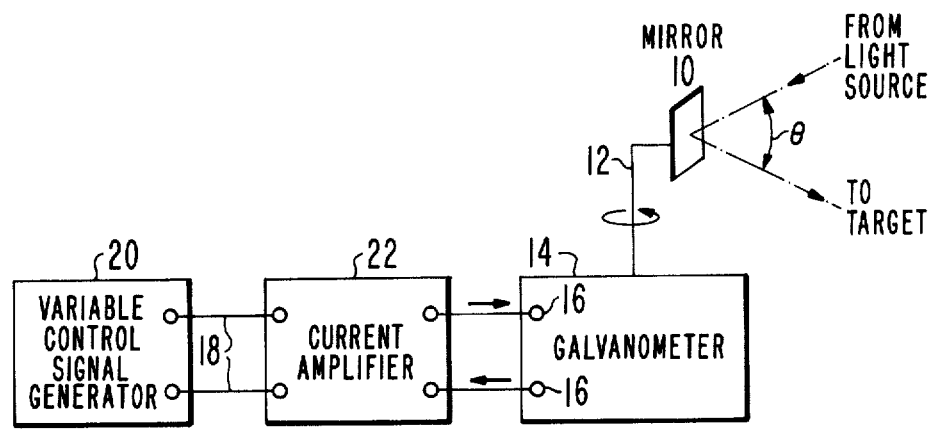
FIG. 1 is a block diagram of a system embodying the invention which includes a variable control signal generator having an output coupled to the input of a mirror galvanometer through a current amplifier.

Referring now to FIG. 1, there is shown deflection mirror 10, supported by rotatable member 12 of galvanometer 14. Galvanometer 14 angularly displaces rotatable member 12 and mirror 10 by an amount determined by the magnitude of the current applied to input terminals 16 of the galvanometer. The magnitude of this current is determined by the value of the control signal then present at output 18 from variable-control signal generator 20. The output 18 is coupled to input terminals 16 through current amplifier 22. Current amplifier 22 may comprise a resistance-controlled current supply, such as Lambda model LA50-03BM, connected to a galvanometer, such as General Scanning G-320.

Light from a light source (not shown) reflected from mirror 10 to a target (not shown) is angularly displaced by a deflection angle $\theta$ having a value which, ideally, should depend solely on the value of the control signal then being applied to output leads 18 of variable-control signal 20. However, due to the fact that the galvanometer 14 exhibits hysteresis, the deflection angle $\theta$, in practice, also depends to a certain extent on the value of the previously applied control signal. The degrading effect on accuracy of this previously applied signal is avoided in a simple manner by the present invention.

Figure 1A:
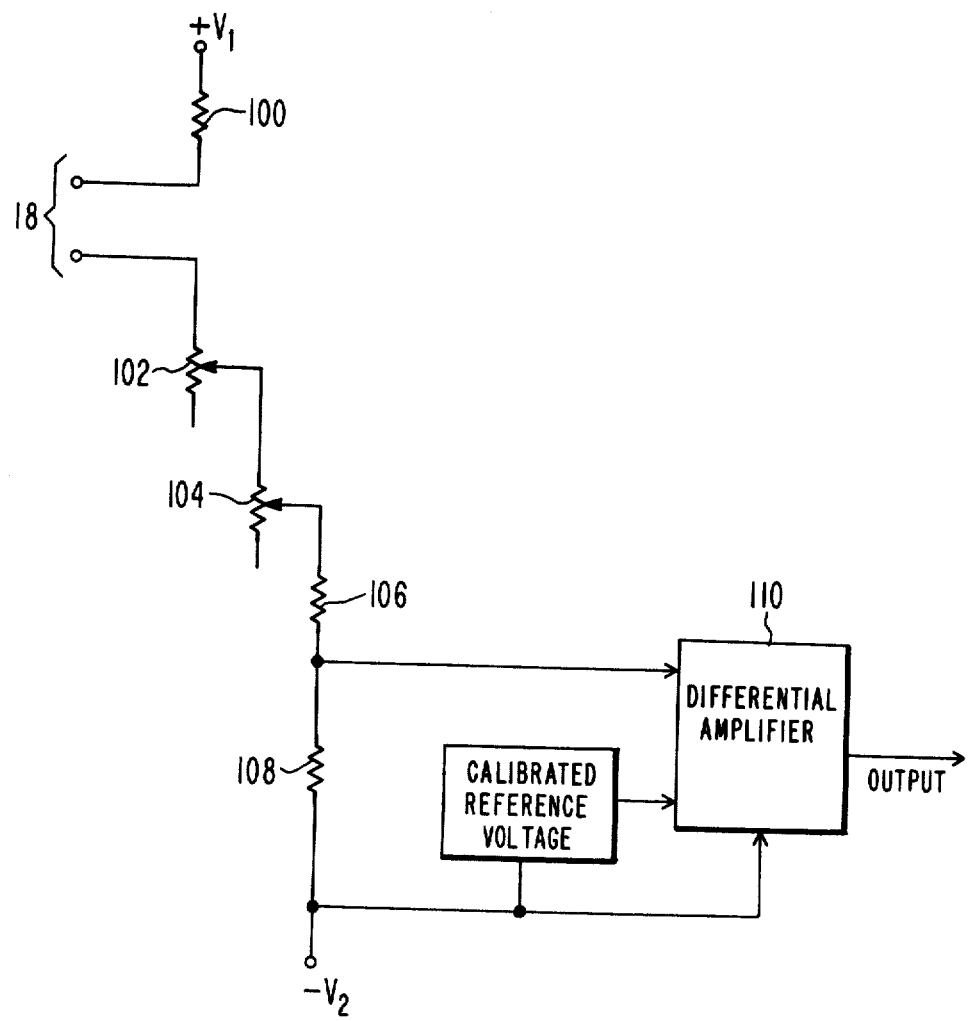
FIG. 1a is a simplified showing of the input stage of a resistance-controlled current supply, such as Lambda Model LA50-03BM.

Referring to FIG. 1a, there is shown the input stage of a typical resistance-controlled current supply, such as Lambda Model LA50-03BM, which may comprise current amplifier 22. Specifically, a resistance voltage divider is connected between a point of positive potential $+V_1$ and a point of negative potential $-V_2$. This voltage divider comprises fixed resistance 100, a remotely-located variable resistance (within variable control signal generator 20) connected across terminals 18, rheostat 102, rheostat 104, fixed resistance 106 and fixed resistance 108, all connected in series with each other. In the aforesaid Lambda Model LA50-3BM, $+V_1$ and $-V_2$ have respective values of $+34$ volts and $-9$ volts. The respective values of resistances 100, 106 and 108 are 7.5 kilohms. Rheostats 102 and 104 have respective maximum values of 1200 ohms and 500 ohms. Rheostats 102 and 104 are independently settable at a desired fraction of their maximum value. As shown, the voltage derived across resistance 108 is applied as a first input to differential amplifier 110, while calibrated reference voltage 112 is applied as a second input to differential amplifier 110. The output of differential amplifier 110, after further amplification, produces a current proportional thereto at terminal 16 of galvanometer 14. The magnitude of this current depends on the particular value of the remotely-located resistance then connected across terminals 18 (assuming, as is the case, that the rheostat 102 and 104 settings remain fixed at a preselected desired value).

Figure 2:
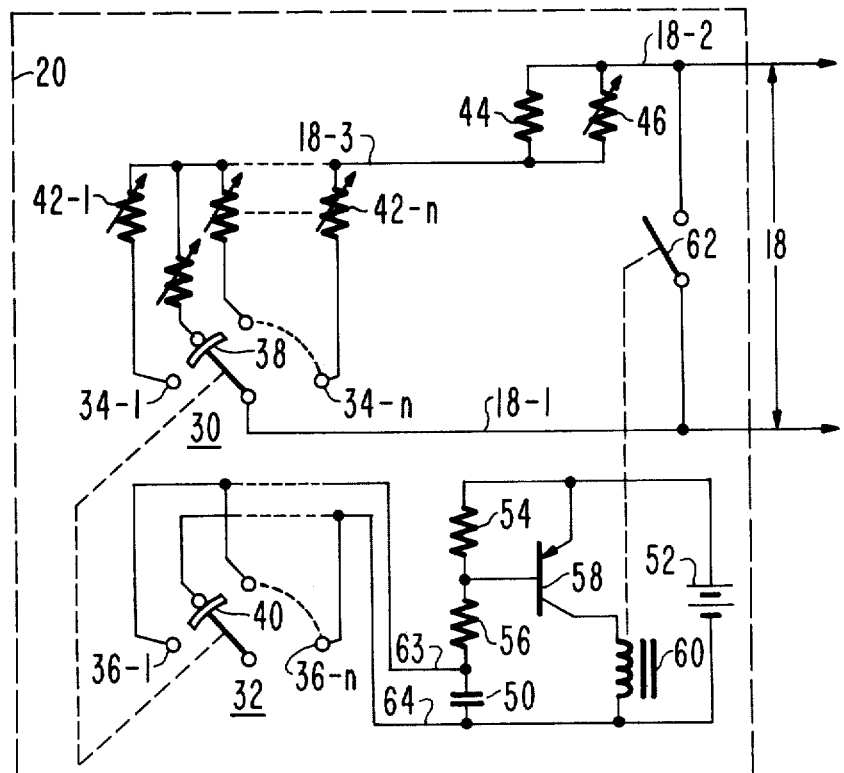
FIG. 2 illustrates an embodiment of the variable-control signal generator of FIG. 1.

Referring now to FIG. 2, variable control-signal generator 20 comprises switch means consisting of ganged first switch 30 and second switch 32. Each of first and second switches 30 and 32 includes a predetermined number of separate switch positions, such as switch positions 34-1 . . . 34-n of first switch 30 and switch positions 36-1 . . . 36-n of second switch 32. Further, both first and second switches 30 and 32 include movable wipers, such as wiper 38 of first switch 30 and movable wiper 40 of second switch 32. Movable wiper 40 of second switch 32 is of the type which provides a make-before-break contact when second switch 32 is moved between switch positions. That is, during movement of the wiper 40, the lagging edge portion of the wiper is still engaged with one contact when its leading edge first engages the following contact and then, as the wiper continues to move, the lagging edge leaves the one contact.

Control-signal means are coupled between first switch 30 and output 18. More specifically, lower conductor 18-1 of output 18 is directly connected to wiper 38. Upper conductor 18-2 of output 18 is connected to each separate one of switch positions 34-1 . . . 34-n through a resistance network. Specifically, each one of switch positions 34-1 . . . 34-n is separately connected to common conductor 18-3 through a corresponding one of adjustable trimming resistances 42-1 ... 42-n, and common conductor 18-3 is connected to output conductor 18-2 through fixed resistance 44 in parallel with adjustable master trimming resistance 46. By way of example, fixed resistance 44 may be 560 ohms and adjustable master trimming resistance 46 may have a maximum resistance of 1,000 ohms.

By adjusting the value of master trimming resistance 46 to a desired selected value and by individually adjusting each of trimming resistances 42-1 ... 42-n to a respective desired value, a separate selected resistance (determined by the position of first switch 30) within a predetermined resistance range is normally presented between output conductors 18-1 and 18-2 of output 18. Each one of these respective selected resistance values represents a separate control signal value at output 18.

Reference signal means are coupled between second switch 32 and output 18. More specifically, capacitance 50 is charged to a positive voltage by battery (or DC power supply) 52 through a charging circuit comprising serially-connected resistances 54 and 56. By way of example, capacitance 50 may be about 25 μfd, resistance 54 may be about 5800 ohms and resistance 56 may be about 2,000 ohms. PNP transistor 58 is maintained cut-off by the positive potential on its base from battery 52 when capacitance 50 is fully charged (because no charging current then flows through resistances 54 and 56). Under these conditions, no current flows through relay coil 60 connected between the collector of transistor 58 and reference potential. Therefore, normally-open relay contacts 62 remain open and have no effect on the control signal then applied to output 18.

As shown in FIG. 2, capacitance 50 is coupled between the odd and even switch positions of second switch 32 by conductors 63 and 64. Therefore, when second switch 32 is operated between switch positions, the make-before-break contact of wiper 40 momentarily engages an odd and an adjacent even switch contact, thereby short circuiting capacitance 50, causing it to discharge. This lowers the potential of the base of the transistor 58 sufficiently to cause relay coil 60 to operate and close contact 62 thereof, thereby short circuiting conductors 18-1 and 18-2 of output 18. The time constant formed by capacitance 50 together with its charging circuit resistances 54 and 56 is sufficiently long to maintain transistor 58 conducting and contacts 62 closed for a relatively long given time (e.g. about one second) after the operation between switch positions is completed. This given time is sufficient for galvanometer hysteresis effects to reach equilibrium.

Thus, whenever first and second ganged switches 30 and 32 are switched from one switch position to another, for the purpose of changing the value of the control signal which is applied to output 18, a predetermined reference signal is always applied to output 18 for a given period of time before the new value of control signal is applied to output 18. Therefore, the degrading effect of galvanometer hysteresis is overcome because the effect of each separate control signal is always determined with respect to the same predetermined reference signal, rather than with respect to the value of that particular one of the predetermined number of control signals which happened to have been previously applied. Thus, repeatable, high-accuracy angular displacement of the rotatable member of a galvanometer exhibiting hysteresis is achieved in a simple manner.

It is known in the art that mechanical switches, such as rotary switches, may be operated remotely by electromechanical means. Further, electronic switches are known in the art which are functionally equivalent to mechanical switches of the type described herein. Therefore, although for illustrative purposes the present invention has been described employing manual mechanical switches, it should be understood that the substitution of other types of functionally equivalent switches therefor is contemplated by the present invention.

In addition, it should be understood that the angular access of volume holograms can be achieved by mounting the volume hologram target directly on the movable member of the galvanometer. In this case, a volume hologram would be illuminated directly and mirror 10 (FIG. 1) would be omitted.

What is claimed is:

1. In a variable control signal generator having an output adapted to be coupled to a galvanometer which exhibits hysteresis, said generator selectively applying any one of a predetermined number of separate discrete control signals to said output thereof for angularly displacing a rotatable member of said galvanometer by an amount which is an analog of the respective value of the control signal then applied to said output; the improvement wherein said generator comprises:
   (a) switch means having said predetermined number of switch positions, said switch means being operable to any ordinal one of the predetermined number of switch positions thereof;
   (b) reference signal means coupled between said switch means and said output and responsive to said switch means being operated between switch positions thereof for applying a certain reference signal to said output for a given time after said operation of said switch means, and
   (c) control-signal means coupled between said switch means and said output and responsive to said switch means remaining in any selected switch position for more than said given time for applying a selected one of said control signals to said output in accordance with the then selected switch position of said switch means.

2. The generator defined in claim 1, wherein said switch means comprises first and second ganged switches each having said predetermined number of switch positions, said reference signal means being coupled between said second switch and said output, and said control signal means being coupled between said first switch and said output.

3. The generator defined in claim 2, wherein said control-signal means comprises means for connecting a resistance of different value across said output for each one of said switch positions to which said first switch is operated, and wherein said reference signal means comprises means for short circuiting said output for said given time in response to said second switch being operated between switch positions thereof.

4. The generator defined in claim 3, wherein said first and second ganged switches are mechanical switches, each including a movable wiper, wherein the wiper of said second switch is a make-before-break wiper, and wherein said reference control means includes a capacitance, a charging circuit for said capacitance having a time constant of at least said given time, said capacitance being connected between the odd and even switch positions to be discharged through said make-before-break wiper whenever said switch means is operated between switch positions, and means coupled to said charging circuit for short circuiting said output after an operation of said switch means until said charging circuit charges said capacitance to a given voltage which is achieved only after a charging time delay equal to said given time.

5. In a system which includes a galvanometer movement to which an electrical signal is applied for deflecting the movement through an angle dependent upon the amplitude of the signal and in which the signal amplitude may be changed to different discrete levels to change said angle, and wherein the movement exhibits hysteresis so that each time the signal amplitude is changed from any one discrete level to any other discrete level, the new angle to which the movement rotates will depend not only on said other level but also to a certain extent on the previous level of said signal, the improvement comprising:

reference-level means for always returning the value of said electrical signal to the same reference level for an interval of time between the time said signal changes from any one discrete level to just before it is placed at any other discrete level.

6. The system defined in claim 5 wherein said reference-level means includes a make-before-break means responsive to change of said signal from any one discrete level for initiating the return of the value of said electrical signal to said reference level.

7. The system defined in claim 6, wherein said reference-level means further includes means responsive to said initiation for maintaining the value of said electrical signal at said reference level for said interval of time.

* * * * *